United States Patent [19]

Feick

[11] Patent Number: 4,602,316
[45] Date of Patent: Jul. 22, 1986

[54] STRUCTURE AND METHOD FOR INTERCONNECTING PRINTED CIRCUIT BOARDS

[75] Inventor: Walter B. Feick, Oldwick, N.J.

[73] Assignee: RCA Corporation, Princeton, N.J.

[21] Appl. No.: 717,721

[22] Filed: Mar. 29, 1985

[51] Int. Cl.$^4$ .............................................. H05K 1/14
[52] U.S. Cl. ...................................... 361/412; 29/830;
    29/843; 174/117 F; 361/391; 361/403
[58] Field of Search ...... 174/117 F, 117 FF, 117 AS;
    361/393, 395, 407–408, 412–413; 339/17 CF,
    17 B, 17 L, 17 LC, 17 M, 17 LM; 29/830, 843

[56] References Cited

U.S. PATENT DOCUMENTS

| 3,553,532 | 1/1971 | Cheshire | 317/100 |
| 3,794,522 | 2/1974 | Mueller et al. | 174/117 F |
| 4,109,299 | 8/1978 | Coesentino | 361/412 |
| 4,245,876 | 1/1981 | Ritchie et al. | 339/59 |

FOREIGN PATENT DOCUMENTS 2320202  11/1974  Fed. Rep. of Germany ........ 339/17 LM

OTHER PUBLICATIONS

Vaughan, E., *Flexible Tape Cable*, IBM Technical Disclosure Bulletin, vol. 8, No. 11, Apr. 1966, p. 1485.

Primary Examiner—Arthur T. Grimley
Assistant Examiner—Jane K. Lau
Attorney, Agent, or Firm—E. M. Whitacre; D. H. Irlbeck; T. H. Magee

[57] ABSTRACT

A technique for interconnecting a plurality of stacked printed circuit boards, each board having a plurality of spaced contact areas at an edge thereof, utilizes a multiconductor cable having a plurality of insulation-stripped window regions therein at predetermined intervals. The cable is continuous through a plurality of the window regions which are positioned, respectively, adjacent the edges of the printed circuit boards so that, at each window region, each stripped wire is aligned with a different contact area. The stripped wires are soldered in bulk to their respective contact areas.

16 Claims, 4 Drawing Figures

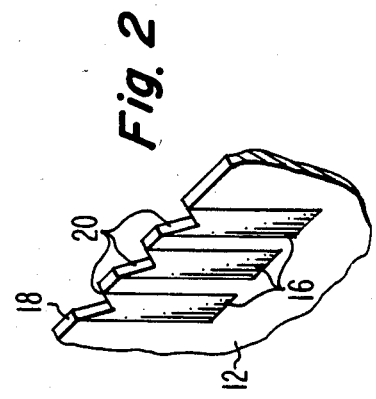
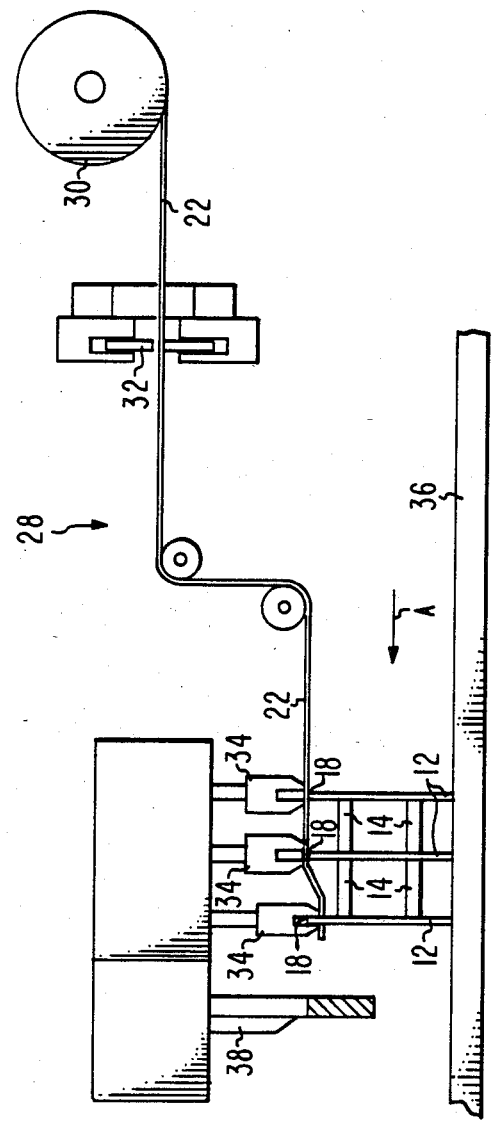

STRUCTURE AND METHOD FOR INTERCONNECTING PRINTED CIRCUIT BOARDS

BACKGROUND OF THE INVENTION

This invention pertains to a structure and method for interconnecting a plurality of stacked printed circuit boards.

In order to reduce the costs in the manufacture of television (TV) instruments, it is necessary to automate factory assembly lines. A major effort in this area is the development of an Advanced Instrument Line (AIL) for automating the assembly of modular TV components. The AIL system comprises several automatic-assembly work stations where one or more modular components are accurately located for assembly and subjected to a mechanized assembly operation.

One cost effective approach used in the automatic assembly of TV instruments in an AIL is to assemble parts in layers in a stack to form a compact unit or module. This approach can be utilized to satisfy the modular demands of a varied product mix for future TV instruments. The effectiveness of the approach is largely dependent on successful design treatment of the wired interconnections between printed circuit (PC) boards. Typically, the PC boards have spaced contact areas at the edges thereof and are interconnected by various connectors which are relatively costly. For example, U.S. Pat. Nos. 4,245,876 and 4,028,794, both issued to Ritchie et al., disclose a laminated connector and method for making same comprising a plurality of identical elongated metal contacts, each of which is a resilient spring, spaced along a continuous web of insulative material which serves to locate the contacts in desired positions and provides an insulation back or cover for the contacts. The present invention provides a structure and method for automatically interconnecting a layered assembly of printed circuit boards which is fast and accurate, and eliminates the expense and unreliability of conventional connectors.

SUMMARY OF THE INVENTION

The present invention comprises a structure and method for interconnecting a plurality of stacked printed circuit boards, each board having a plurality of spaced contact areas at an edge thereof, wherein a multiconductor cable has a plurality of insulation-stripped window regions therein at predetermined intervals. The cable is continuous through a plurality of the window regions which are positioned, respectively, adjacent the edges of the printed circuit boards so that, at each window region, each stripped wire is aligned with a different contact area. The stripped wires are soldered in bulk to their respective contact areas.

BRIEF DESCRIPTION OF THE DRAWINGS

FIG. 2 is a partial perspective view of a portion of a second embodiment of the present invention.

FIG. 4 is a diagrammatic elevation view of an embodiment of a system for performing the method of assembly according to an aspect of the present invention.

DETAILED DESCRIPTION OF THE PREFERRED EMBODIMENTS

Figure 1:
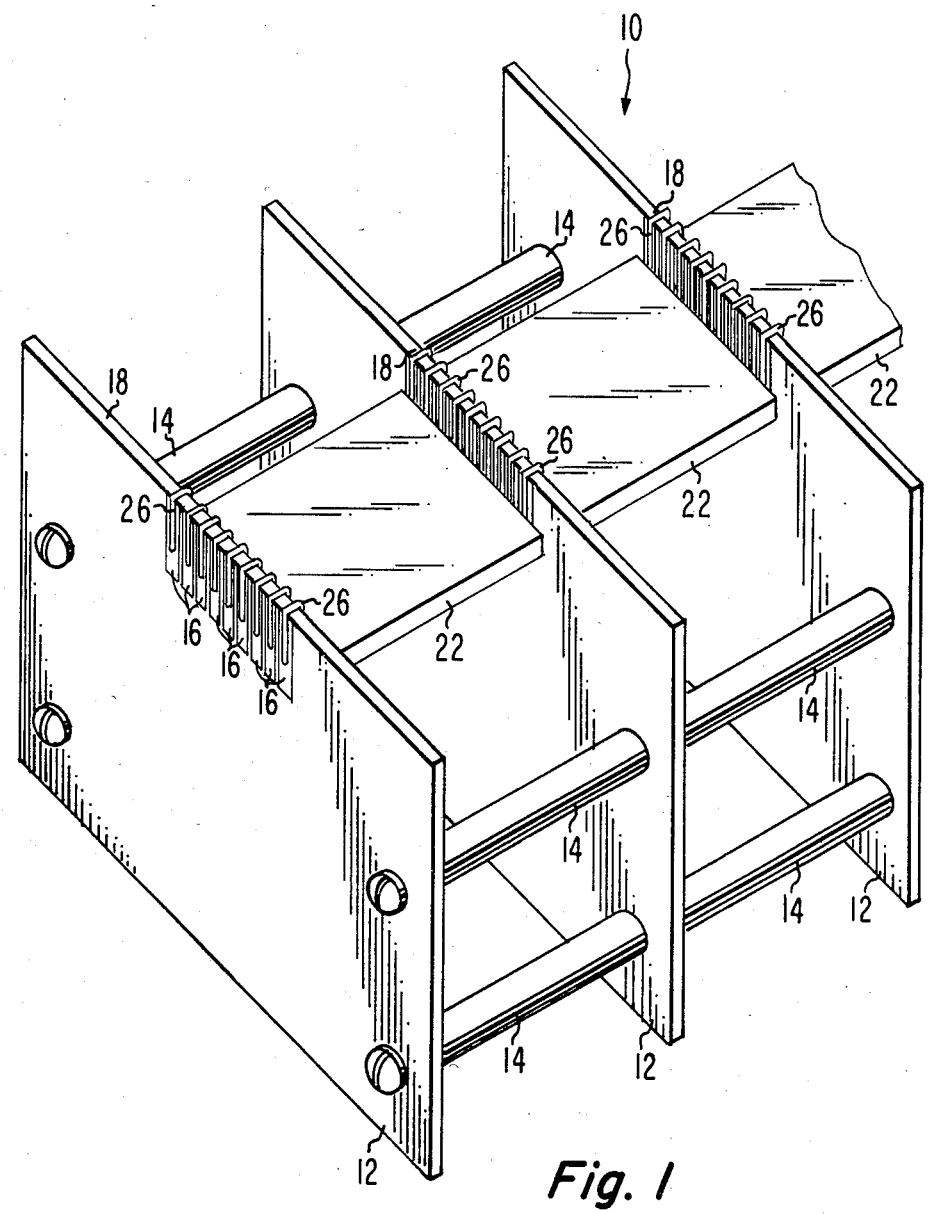
FIG. 1 is a perspective view of an embodiment of the present invention.

FIG. 1 of the drawings shows a structure 10 in which a plurality of stacked printed circuit (PC) boards 12 are interconnected. The PC boards 12 are disposed parallel to each other in a spaced stack-like arrangement and held together by spacers 14 connected to the four corners thereof to form a layered assembly. Each PC board 12 has a plurality of spaced contact areas 16 at an edge 18 thereof. The contact areas 16 may comprise copper etched edge pad terminals that are pre-tinned. FIG. 2 shows a portion of a second embodiment wherein each of the contact areas 16 has a V-shaped groove 20 notched therein. The grooves 20 help to prevent lateral movement of stripped wires positioned therein during a subsequent soldering step, as is described below.

Figure 3:
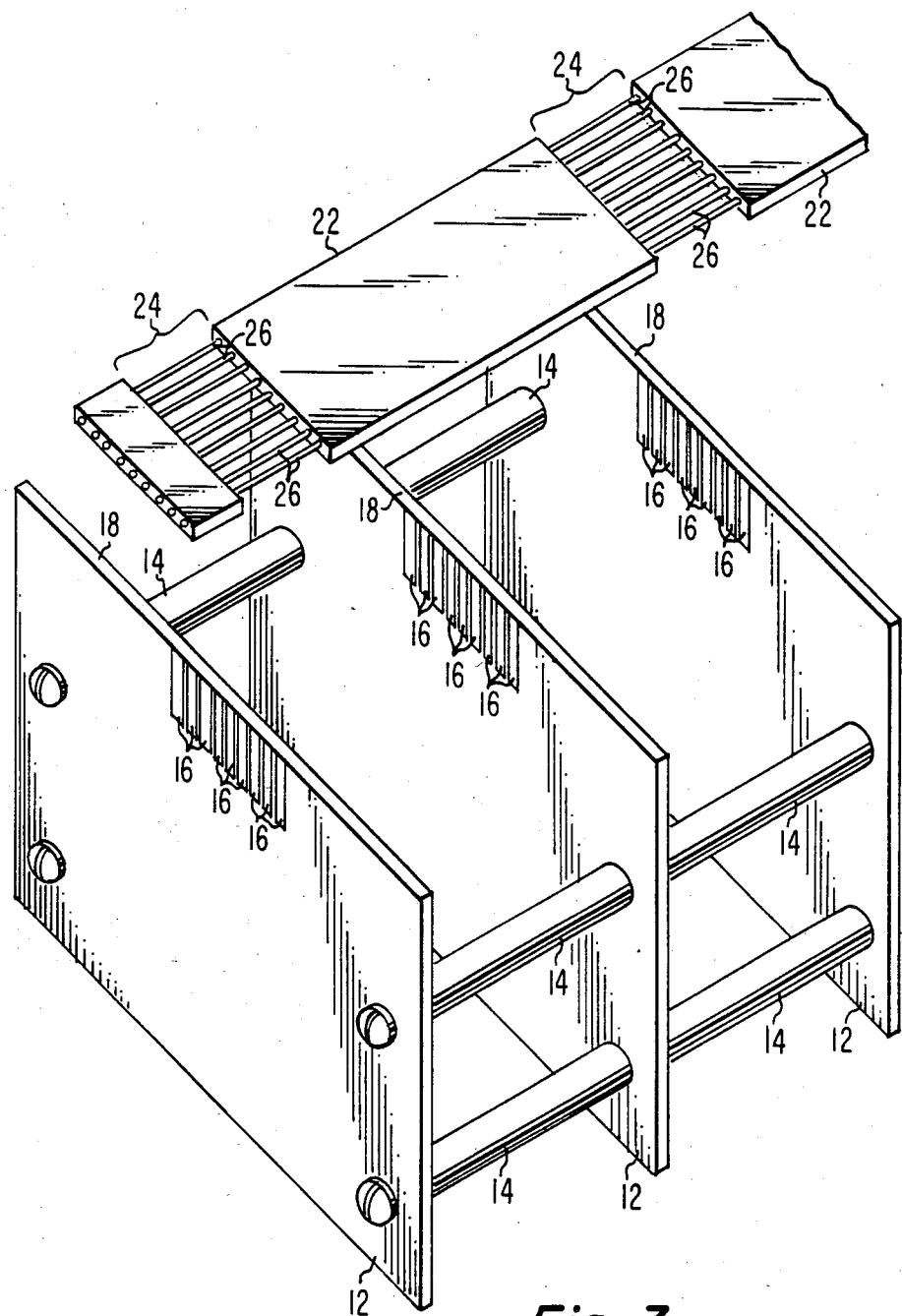
FIG. 3 is a perspective view of parts of the embodiment shown in FIG. 1 during an intitial assembly step in the present method.

A continuous insulated multiconductor cable 22 electrically interconnects the PC boards 12, as shown in FIG. 1. As is shown in FIG. 3, which shows the embodiment of FIG. 1 during an initial assembly step, the multiconductor cable 22 has a plurality of insulation-stripped window regions 24 therein at predetermined intervals. The cable 22 is continuous through a plurality of these window regions 24, and has a plurality of bare conducting wires 26 juxtaposed in a substantially parallel relationship at each window region 24. Preferably, the multiconductor cable 22 comprises a flat cable, and the insulation is stripped therefrom across the complete width of the cable 22 at the window regions 24.

The window regions 24 in the cable 22 are positioned, respectively, adjacent the edges 18 of the PC boards 12 so that, at each window region 24, each stripped wire 26 is aligned with a different contact area 16. Preferably, the stripped wires 26 are bent around the edges 18 so as to have a U-shaped profile which facilitates their making contact with the respective contact areas 16, as shown in FIG. 1. The interconnection is completed by having the wires 26 soldered to their respective contact areas.

FIG. 4 shows a system 28 for performing the present method of interconnecting the PC boards 12 in the layered assembly. The insulation is first removed from the cable 22 at predetermined intervals to form the insulation-stripped window regions 24. The intervals are determined by the spacing between the PC boards 12. Preferably, toward this end, the system 28 includes equipment which feeds the flat cable 22 from a spool 30 through an automatic wire stripper 32, as shown in FIG. 4. Although the insulation can be removed by any technique, ideally, this step is accomplished by a commercial wire stripper. Such a wire stripper is available as Model 46A from Carpenter Manufacturing Company, Manlius, N.Y.

The layered assembly of PC boards 12 is transported to a work station, disposed beneath a series of U-shaped applicators 34, by a conveyor belt 36 which moves in a direction, shown by arrow A in FIG. 4, orthogonal to the planar surfaces of the PC boards 12. The cable 22, after stripping, continues to feed to a location above the contact areas 16 of the PC boards 12 by moving in the direction of arrow A so that the window regions 24 in the cable 22 are positioned, respectively, adjacent the edges 18 of the PC boards 12. At each window region 24, each stripped wire 26 is aligned with a different contact area 16, as shown in greater detail in FIG. 3.

The stripped wires 26 are then formed around the edges 18 of the respectively adjacent PC boards 12 so that each wire 26 touches its adjacent contact area 16. In the present embodiment, this forming step is performed by placing the U-shaped applicators 34 against the stripped wires 26 opposite each of the edges 18 and pressing the open U-shaped portions of the applicators 34 over the edges 18, whereby the wires 26 are forcibly bent around the edges 18 to form U-shaped profiles. The forming step can be done to each board 12 one at a time in sequence, as shown in FIG. 4, or can be performed simultaneously with respect to all PC boards 12 in a given assembly.

The conveyor belt 36 next transports the layered assembly of PC boards 12 to a station where a shearing device 38 cuts the cable 22. The present interconnect method is completed by soldering the wires 26 to their respective contact areas 16 at another station (not shown) along the conveyor belt 36. The soldering step may be performed by passing the layered assembly of PC boards 12 through a reflow solder position where the pre-tinned contact areas 16 are heated by infrared radiation. Alternatively, the soldering step may be performed by wave soldering. Preferably, the soldering step is performed simultaneously with respect to all PC boards 12 in a given assembly. Such a bulk soldering operation has been shown to provide successful results.

The essence of the present technique is the use of the multiconductor cable 22 which is formed to act as its own connector, and the fact that no other mechanical connector is needed to make contact between the layered assembly of PC boards 12. A standard mechanical connector may still be used in conjunction with this technique to make electrical connection to other PC boards or equipment. The economic benefits of the present concept are that it lends itself to a quick bulk soldering operation, and no costly connectors are required.

What is claimed is:

1. A method for interconnecting a plurality of printed circuit boards, each board having a plurality of spaced contact areas at an edge thereof, comprising the steps of:
   removing insulation from an insulated multiconductor cable at predetermined intervals to form a plurality of insulation-stripped window regions in said cable, said cable having a plurality of conducting wires juxtaposed in a substantially planar relationship at said window regions;
   positioning said window regions, respectively, adjacent said edges of the printed circuit boards so that, at each window region, each stripped wire is aligned with a different contact area;
   forming the stripped wires around said edges of the respectively adjacent printed circuit circuit boards so that each wire touches its adjacent contact area; and
   soldering the stripped wires to their respective contact areas.

2. A method as recited in claim 1 wherein said insulated multiconductor cable comprises a flat cable, and wherein said removing step is performed by removing the insulation therefrom across the complete width of said cable.

3. A method as recited in claim 2 wherein said flat cable is initially wound on a spool, and wherein said removing step is performed by feeding the flat cable from said spool and into a wire stripper.

4. A method as recited in claim 3 wherein said positioning step is performed by continuing to feed said flat cable from said wire stripper towards each of said printed circuit boards in a direction orthogonal to the planar surface thereof.

5. A method as recited in claim 4 wherein said forming step is performed by placing a U-shaped applicator against the stripped wires opposite each of said edges and pressing the open U-shaped portion of said applicator over said edges, whereby said wires are forcibly bent around said edges to form a U-shaped profile.

6. A method as recited in claim 5 wherein said printed circuit boards are disposed parallel to each other in a spaced stack-like arrangement, and wherein said forming step is performed simultaneously with respect to all printed circuit boards.

7. A method as recited in claim 6 wherein each of said contact areas is notched with a V-shaped groove in order to prevent lateral movement of said stripped wires during said forming step and before said soldering step.

8. A method as recited in claim 1 wherein said contact areas comprise copper etched edge pad terminals that are pre-tinned, and wherein said soldering step is performed by solder reflow during infrared heating.

9. A method as recited in claim 8 wherein said soldering step is performed simultaneously with respect to all printed circuit boards.

10. A method as recited in claim 1 wherein said soldering step is performed simultaneously with respect to all printed circuit boards by wave soldering.

11. A structure including a plurality of interconnected printed circuit boards, each board having a plurality of spaced contact areas at an edge thereof, comprising an insulated multiconductor cable having a plurality of insulation-stripped window regions therein at predetermined levels, said cable being continuous through a plurality of said window regions and having a plurality of conducting wires juxtaposed in a substantially parallel relationship at said window regions, the window regions being positioned, respectively, adjacent said edges of the printed circuit boards so that, at each window region, each stripped wire is aligned with a different contact area and bent around said edge to have a U-shaped profile, said wires being soldered to their respective contact areas.

12. A structure as defined in claim 11 wherein said isulated multiconductor cable comprises a flat cable, and wherein said window regions have the insulation stripped therefrom across the complete width of said cable.

13. A structure as defined in claim 11 wherein said printed circuit boards are disposed parallel to each other in a spaced stack-like arrangement.

14. A structure as defined in claim 13 wherein each of said contact areas has a V-shaped groove notched therein.

15. A structure is defined in claim 11 wherein said contact areas comprise copper etched edge pad terminals that are pre-tinned, and wherein said wires are soldered.

16. A structure as defined in claim 11 wherein said wires are wave soldered.

* * * * *